(12) United States Patent
Hiramitsu et al.

(10) Patent No.: US 10,637,224 B2
(45) Date of Patent: Apr. 28, 2020

(54) ELECTRICAL JUNCTION BOX

(71) Applicants: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

(72) Inventors: Hiroomi Hiramitsu, Mie (JP); Tomotaka Kurozu, Mie (JP); Masato Tsutsuki, Mie (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/325,494

(22) PCT Filed: Aug. 9, 2017

(86) PCT No.: PCT/JP2017/028868
§ 371 (c)(1),
(2) Date: Feb. 14, 2019

(87) PCT Pub. No.: WO2018/043073
PCT Pub. Date: Mar. 8, 2018

(65) Prior Publication Data
US 2019/0214805 A1 Jul. 11, 2019

(30) Foreign Application Priority Data
Aug. 30, 2016 (JP) ................. 2016-167616

(51) Int. Cl.
*H02G 3/16* (2006.01)
*B60R 16/02* (2006.01)
(Continued)

(52) U.S. Cl.
CPC ............... *H02G 3/16* (2013.01); *B60R 16/02* (2013.01); *H02G 3/03* (2013.01); *H02G 3/081* (2013.01);
(Continued)

(58) Field of Classification Search
CPC ... H02G 3/16; H05K 7/20236; H05K 7/20927
See application file for complete search history.

(56) References Cited

U.S. PATENT DOCUMENTS 4,893,590 A 1/1990 Kashimura et al.
8,842,408 B2 9/2014 Ikeda et al.
(Continued)

FOREIGN PATENT DOCUMENTS

JP 64-87822 3/1989
JP 2000-315757 11/2000
(Continued)

OTHER PUBLICATIONS

Official Communication issued in International Bureau of WIPO Patent Application No. PCT/JP2017/028868, dated Sep. 5, 2017.

*Primary Examiner* — Mukundbhai G Patel
(74) *Attorney, Agent, or Firm* — Greenblum & Bernstein, P.L.C.

(57) ABSTRACT

An electrical junction box configured to be disposed between a power supply and a load includes a cooling case that has an opening, a circuit assembly that is disposed closing the opening of the cooling case, and a liquid coolant that is stored in the cooling case. The circuit assembly has a case-facing surface that faces the cooling case, and includes a plurality of busbars that are disposed on the
(Continued)

case-facing surface and constitute a conductive path between the power supply and the load. The busbars are immersed in the liquid coolant R.

9 Claims, 16 Drawing Sheets

(51) Int. Cl.
    *H05K 7/06*     (2006.01)
    *H05K 7/20*     (2006.01)
    *H02G 3/03*     (2006.01)
    *H02G 3/08*     (2006.01)
    *H02G 5/10*     (2006.01)

(52) U.S. Cl.
    CPC ................ *H02G 5/10* (2013.01); *H05K 7/06* (2013.01); *H05K 7/20* (2013.01); *H05K 7/20236* (2013.01); *H05K 7/20254* (2013.01); *H05K 7/20272* (2013.01)

(56) References Cited

U.S. PATENT DOCUMENTS

| | | | |
|---|---|---|---|
| 2007/0230127 A1* | 10/2007 | Peugh | H01L 23/053 |
| | | | 361/699 |
| 2011/0261498 A1 | 10/2011 | Ikeda et al. | |
| 2013/0278090 A1* | 10/2013 | Matsuo | H02K 5/20 |
| | | | 310/54 |

FOREIGN PATENT DOCUMENTS

| | | |
|---|---|---|
| JP | 2011-088598 | 5/2011 |
| JP | 2013-034273 | 2/2013 |

\* cited by examiner

ELECTRICAL JUNCTION BOX

TECHNICAL FIELD

The technology disclosed in the present specification relates to an electrical junction box.

BACKGROUND ART

A battery module serving as a driving source is installed in vehicles such as electric automobiles and hybrid automobiles. The battery module includes a plurality of single cells and supplies power to a load such as a motor. An electrical junction box that turns on/off the power supplied to the load is connected to the battery module.

CITATION LIST

Patent Documents

Patent Document 1: JP 2011-88598A

SUMMARY OF INVENTION

Technical Problem

Recently, there has been a demand to let relatively high currents flow in electric automobiles and hybrid automobiles. The higher the current value, the larger the amount of heat generated in the electrical junction box.

In order to reduce the amount of heat to be generated, it is conceivable to reduce the electrical resistance value of a conductive member provided in the electrical junction box. In order to reduce the resistance value of the conductive member, it is conceivable to increase the cross-sectional area of the conductive member. However, simply increasing the cross-sectional area of the conductive member results in an increase in the size of the electrical junction box as a whole and is not practicable. Thus, it is desired to efficiently cool the electrical junction box when current flows.

Solution to Problem

An electrical junction box disclosed in the present specification is configured to be disposed between a power supply and a load, and includes a case that has an opening, a circuit assembly that is disposed closing the opening of the case, and a liquid coolant that is stored in the case, wherein the circuit assembly has a case-facing surface that faces the case, and includes a busbar that is disposed on the case-facing surface and constitutes a conductive path between the power supply and the load, and the busbar is immersed in the liquid coolant.

In the electrical junction box, a relatively high current flows through the busbar that constitutes the conductive path between the power supply and the load, and accordingly, a relatively large amount of heat is generated from the busbar. With the above-described configuration, since the busbar is immersed in the liquid coolant, the heat that is generated by the busbar when current flows is transferred to the liquid coolant. Thus, the busbar can be efficiently cooled, and therefore, the electrical junction box in which the busbar is arranged can be efficiently cooled. Moreover, a member that generates a relatively small amount of heat, of the members installed in the circuit assembly can be disposed on a surface of the circuit assembly on the opposite side to the case, and therefore, the size of the case and the amount of liquid coolant can be set to be the minimum necessary size and amount.

In the above-described configuration, it is also possible that the circuit assembly includes a relay that has a terminal, the terminal includes a contact portion connected to the busbar, and the contact portion is immersed in the liquid coolant.

With this configuration, since the contact portion that generates a relatively large amount of heat is immersed in the liquid coolant, the heat that is generated by the contact portion when current flows is transferred to the liquid coolant. Thus, the electrical junction box in which the relay is arranged can be efficiently cooled.

In the above-described configuration, it is also possible that the circuit assembly includes a main relay, as well as a precharge relay and a precharge resistor that are connected to the main relay in parallel and constitute a precharge circuit, and the precharge resistor is immersed in the liquid coolant.

With this configuration, since the precharge resistor that generates a relatively large amount of heat is immersed in the liquid coolant, the heat that is generated by the precharge resistor when current flows is transferred to the liquid coolant. Thus, the electrical junction box in which the precharge resistor is arranged can be efficiently cooled.

In the above-described configuration, it is also possible that the case has an inlet port through which the liquid coolant can flow into the case and an outlet port through which the liquid coolant can flow out of the case.

With this configuration, the liquid coolant that has been cooled can be allowed to flow into the case through the inlet port, and the liquid coolant whose temperature has been increased as a result of receiving the heat can be allowed to flow to the outside of the case through the outlet port. Thus, the efficiency of cooling the electrical junction box can be improved.

In the above-described configuration, it is also possible that the case includes a heat sink that is in contact with the liquid coolant.

With this configuration, the heat that has been received by the liquid coolant can be efficiently dissipated via the heat sink. Thus, the efficiency of cooling the electrical junction box can be improved.

Advantageous Effects of Invention

According to the technology disclosed in the present specification, an electrical junction box can be efficiently cooled.

DESCRIPTION OF EMBODIMENTS

Embodiment 1

Figure 1:
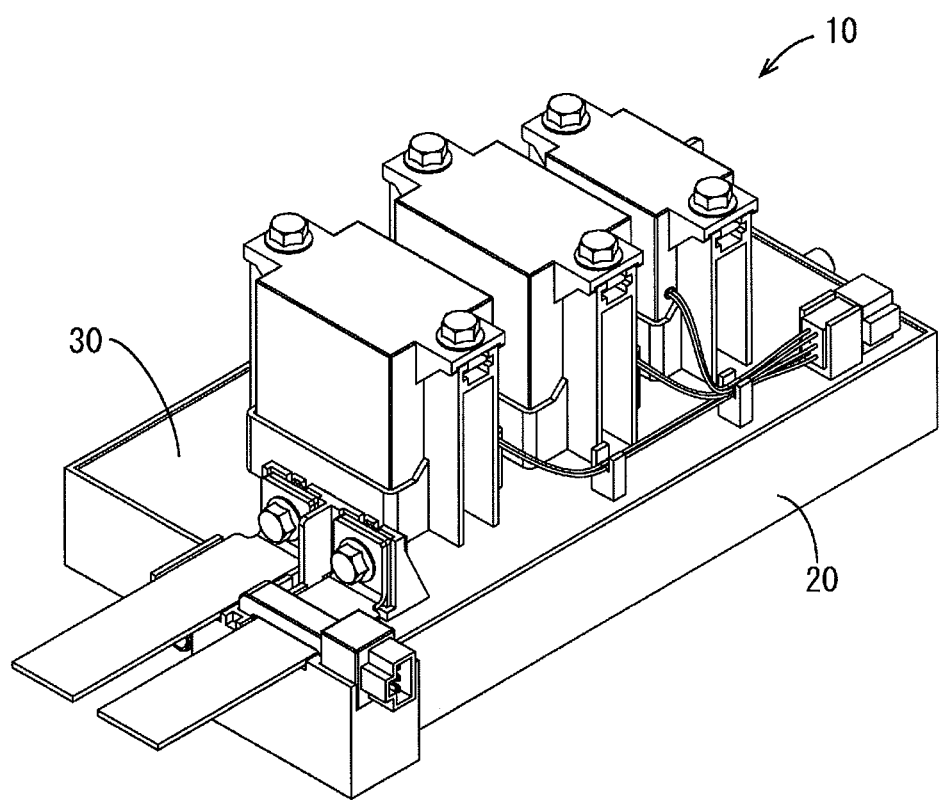
FIG. 1 is a first perspective view of an electrical junction box of Embodiment 1.
Figure 2:
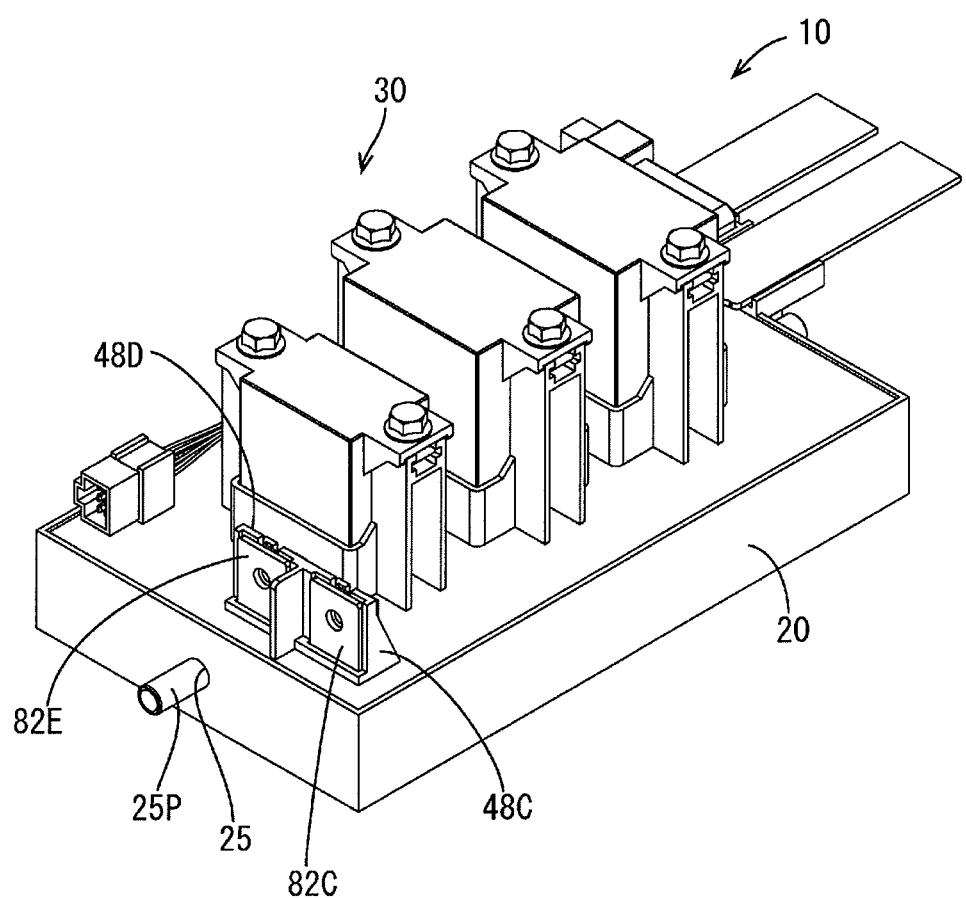
FIG. 2 is a second perspective view of the electrical junction box.

Embodiment 1 will be described with reference to FIGS. 1 to 13. An electrical junction box 10 of the present embodiment is a device that is installed in a vehicle (not shown) such as an electric automobile or a hybrid automobile and turns on/off the power supplied from a power supply to a load, which are not shown. As shown in FIG. 1, the electrical junction box 10 includes a cooling case 20 (corresponding to a case) and a circuit assembly 30 that is attached to the cooling case 20. A liquid coolant R is stored in the cooling case 20.

Cooling Case 20

Figure 5:
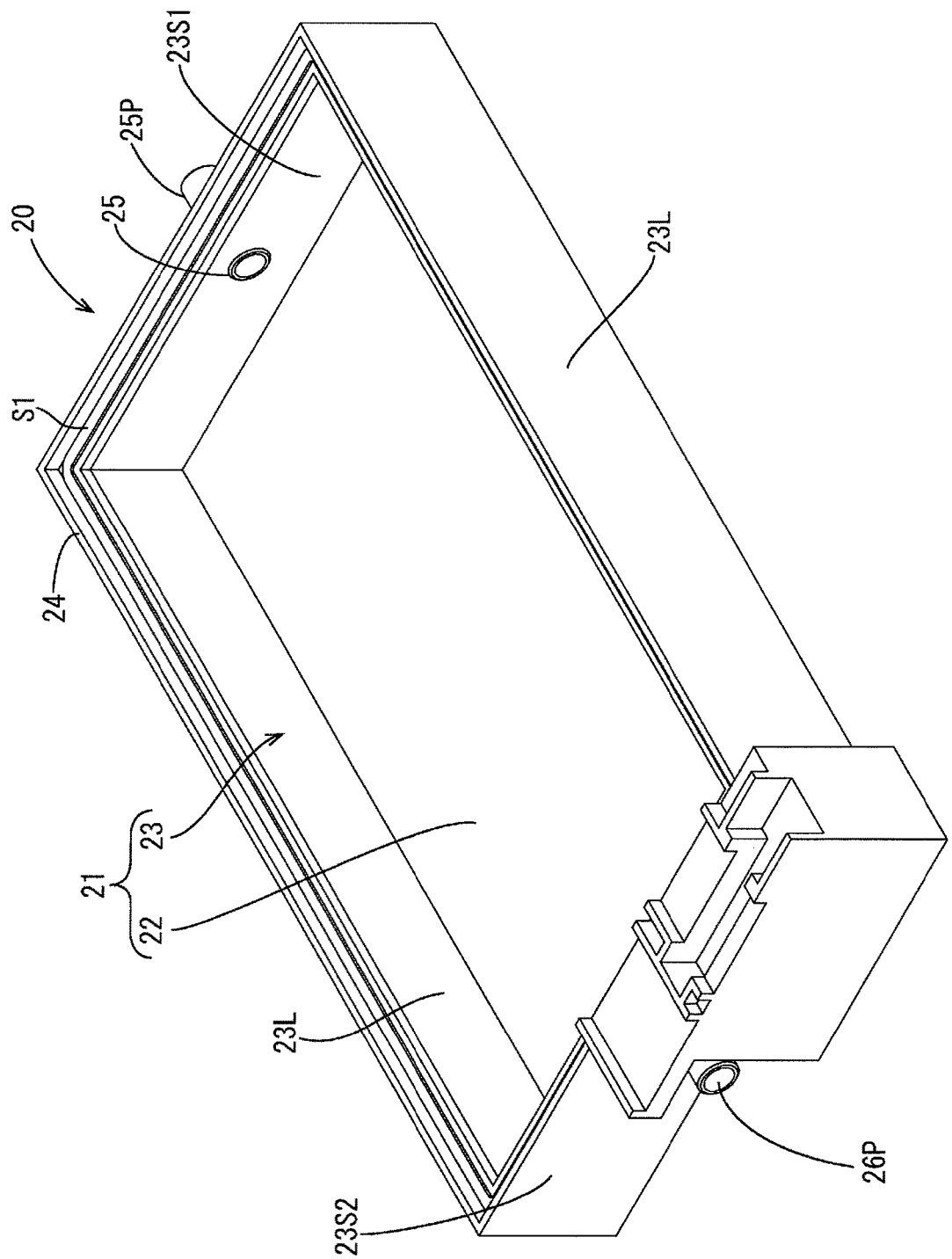
FIG. 5 is a perspective view of a cooling case.

The cooling case 20 is made of an insulating synthetic resin, and includes, as shown in FIG. 5, a case main body 21, as well as an inlet pipe 25P and an outlet pipe 26P that are connected to the case main body 21. The case main body 21 includes a substantially oblong bottom wall 22 and a peripheral wall 23 extending from an outer peripheral edge of the bottom wall 22 perpendicularly to the bottom wall 22, and constitutes a rectangular vessel having an opening 24 on the opposite side to the bottom wall 22. In the following description, the two wall portions, of the peripheral wall 23, extending from the two long sides of the bottom wall 22 will be referred to as long-side walls 23L, and the two wall portions extending from the two short sides of the bottom wall 22 will be referred to as short-side walls 23S1 and 23S2.

Figure 9:
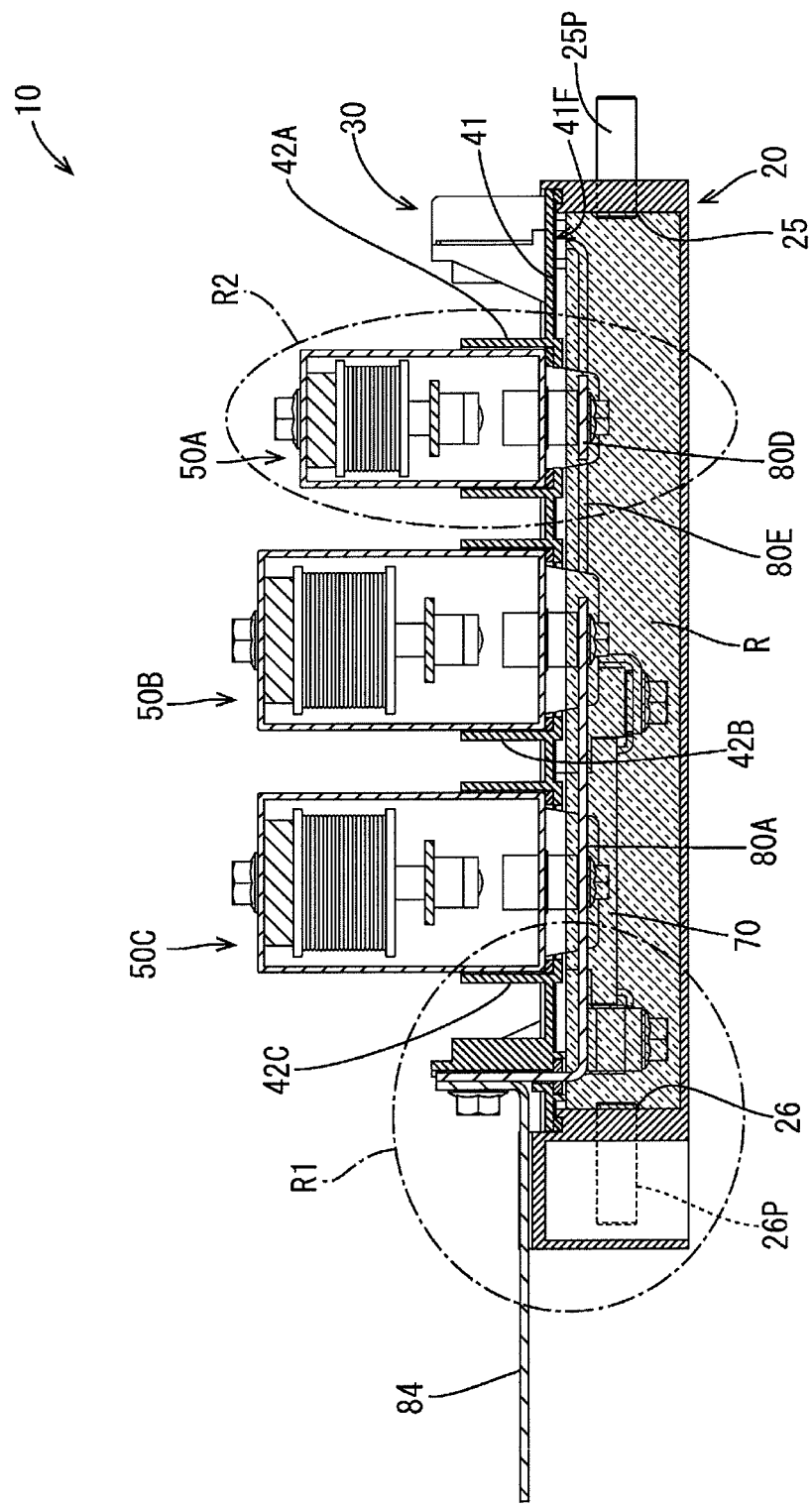
FIG. 9 is a cross-sectional view taken along line A-A in FIG. 4.

As shown in FIGS. 5 and 9, one short-side wall 23S1 of the two short-side walls 23S1 and 23S2 has an inlet port 25 passing through that short-side wall 23S1 from an outer side surface to an inner side surface thereof, and the inlet pipe 25P, which has a tubular shape, is inserted into the inlet port 25. The other short-side wall 23S2 has an outlet port 26 passing through this short-side wall 23S2 from an outer side surface to an inner side surface thereof, and the outlet pipe 26P, which has a tubular shape, is inserted in the outlet port 26.

Figure 11:
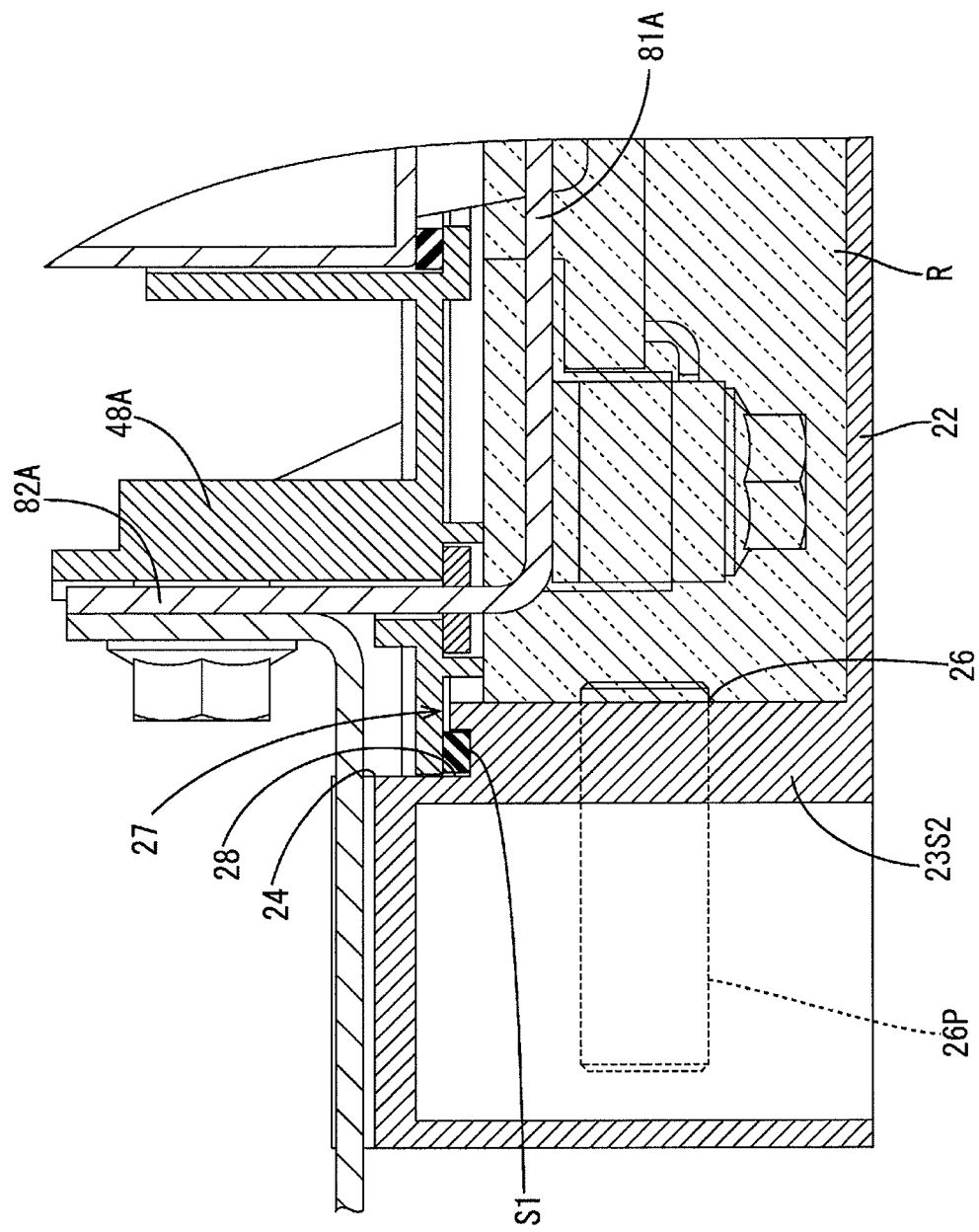
FIG. 11 is an enlarged view of an area within a circle R1 in FIG. 9.

As shown in FIG. 11, the peripheral wall 23 has a support surface 27 that supports the circuit assembly 30. The support surface 27 is a surface that is formed by cutting the lip of the opening 24 and is parallel to the bottom wall 22. The support surface 27 has a seal groove 28. The seal groove 28 is a recess that is recessed from the support surface 27 toward the bottom wall 22, and a seal ring S1 is accommodated in the seal groove 28 in a state in which it slightly protrudes from the seal groove 28. The seal ring S1 is an oblong frame-shaped member formed of an elastic member made of rubber or the like.

The liquid coolant R, which has insulating properties, is stored in the cooling case 20. For example, one or more coolants selected from the group consisting of perfluorocarbons, hydrofluoroethers, hydrofluoroketones, fluorine-inert liquids, oils such as silicone oil and mineral oil, and hydrocarbon-based coolants can be used as the liquid coolant R. In FIGS. 9, 10, 11, and 12, the liquid coolant R is indicated by hatching.

Figure 13:
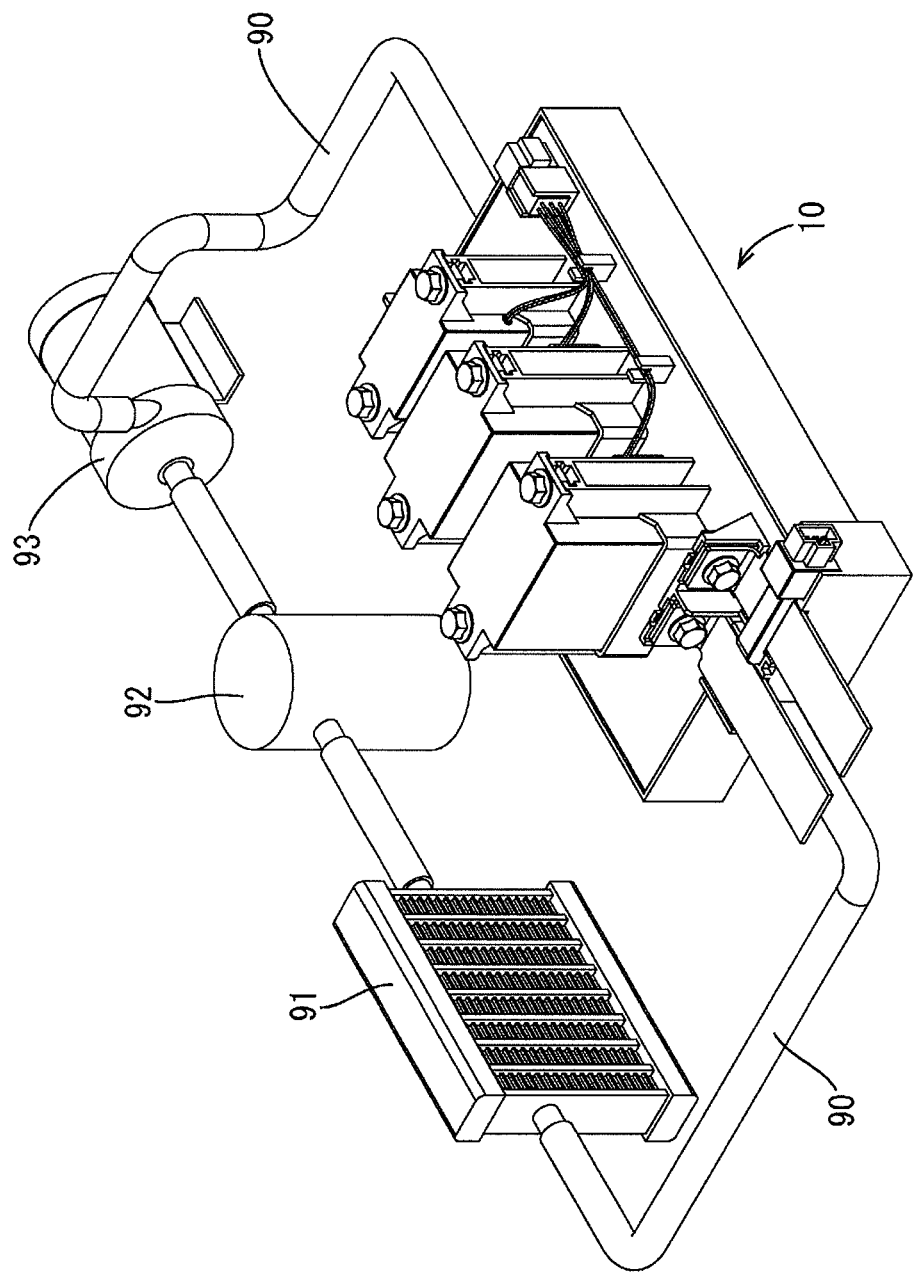
FIG. 13 is a perspective view showing a state in which a radiator, a reservoir tank, and a pump are connected to the electrical junction box.

As shown in FIG. 13, a radiator 91, a reservoir tank 92, and a pump 93 that have known configurations can be connected to the electrical junction box 10 via connecting pipes 90 connected to the inlet pipe 25P and the outlet pipe 26P, and the liquid coolant R that has been cooled by the radiator 91 can be circulated through the cooling case 20.

Circuit Assembly 30

Figure 3:
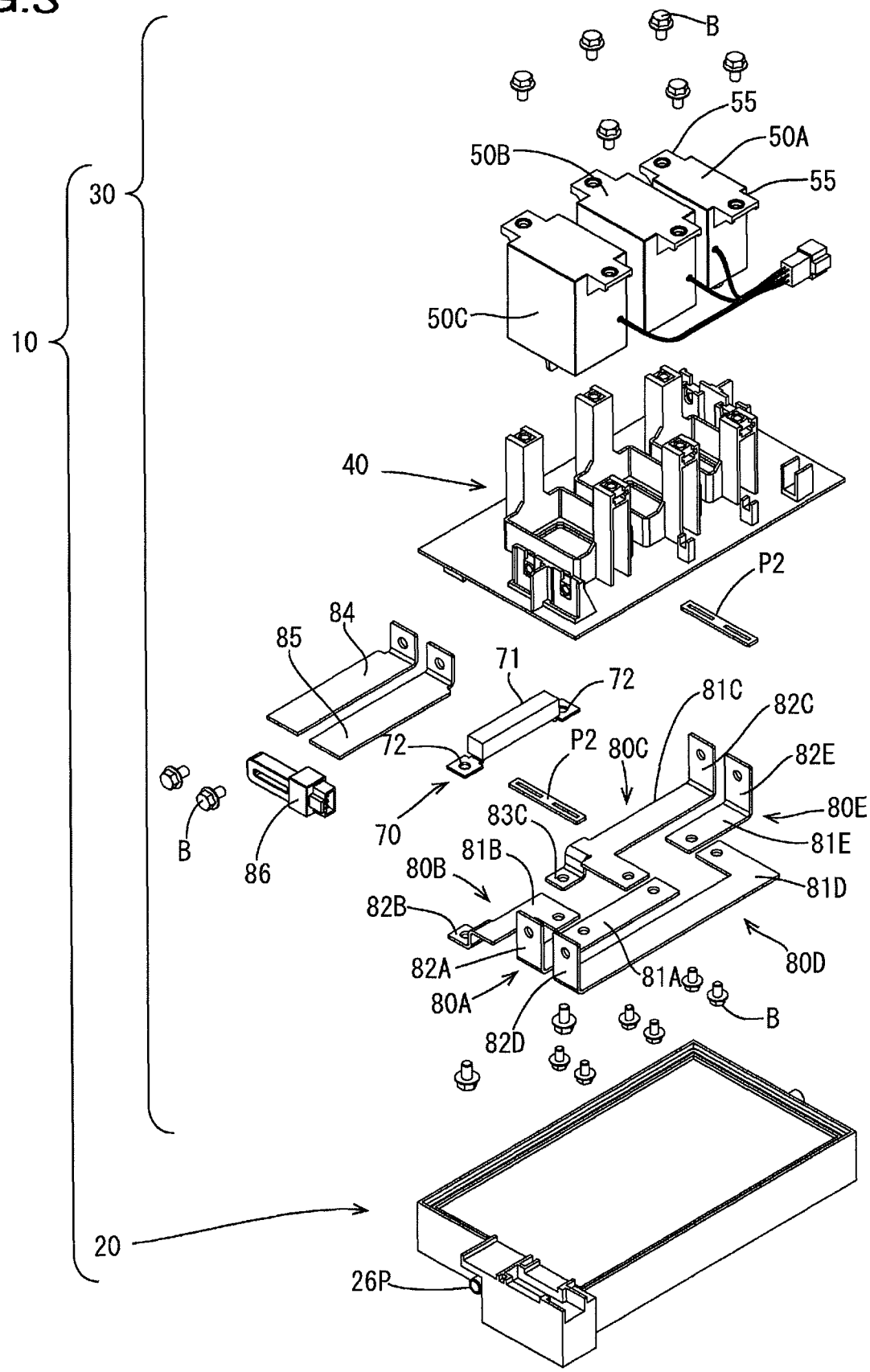
FIG. 3 is an exploded perspective view of the electrical junction box.
Figure 10:
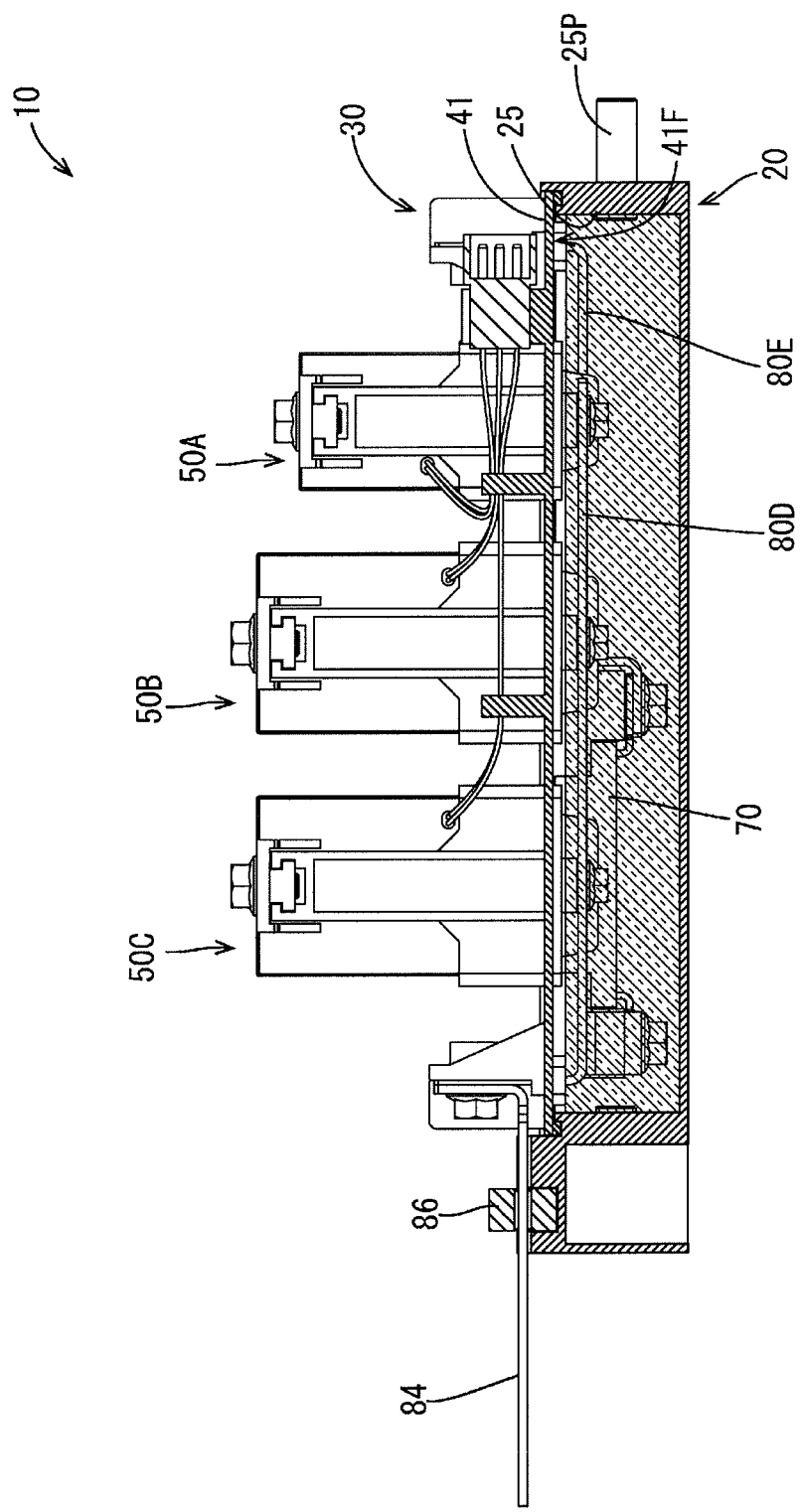
FIG. 10 is a cross-sectional view taken along line B-B in FIG. 4.

As shown in FIGS. 9 and 10, the circuit assembly 30 is a member that is disposed closing the opening 24 of the cooling case 20. As shown in FIG. 3, the circuit assembly 30 includes a switchboard 40, a plurality of busbars 80A, 80B, 80C, 80D, and 80E that are attached to the switchboard 40 and constitute a conductive path between a power supply and a load, two main relays 50B and 50C (corresponding to a relay), as well as a precharge relay 50A (corresponding to the relay) and a precharge resistor 70 that are connected to the two main relays 50B and 50C in parallel and constitute a precharge circuit.

Switchboard 40

Figure 8:
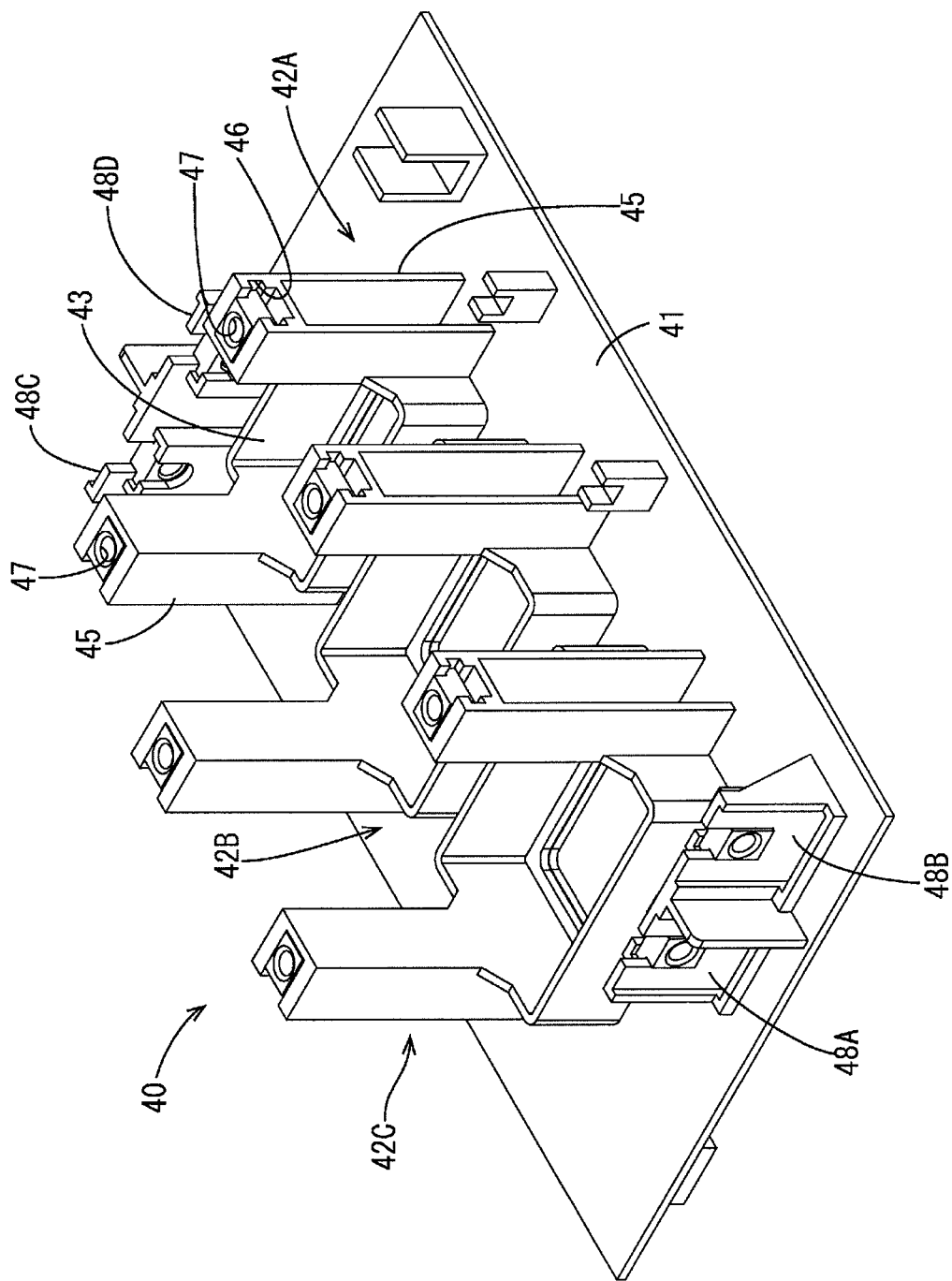
FIG. 8 is a perspective view of a switchboard.

The switchboard 40 is made of a synthetic resin, and includes, as shown in FIG. 8, an oblong plate-shaped main plate 41, three relay-retaining portions 42A, 42B, and 42C that are arranged on the main plate 41, and four connectors 48A, 48B, 48C, and 48D. As shown in FIGS. 9 and 10, the main plate 41 is disposed closing the opening 24 of the cooling case 20, and a peripheral edge portion thereof is supported by the support surface 27. As shown in FIG. 11, a configuration is adopted in which a gap between the cooling case 20 and the switchboard 40 is sealed in a liquid-tight manner by the seal ring S1 being clamped between an inner wall of the seal groove 28 and the main plate 41. One surface of the main plate 41 constitutes a case-facing surface 41F that faces the cooling case 20.

The first relay-retaining portion 42A, the second relay-retaining portion 42B, and the third relay-retaining portion 42C are arranged in this order from the right side in FIG. 9. The second relay-retaining portion 42B and the third relay-retaining portion 42C have the same configuration as the first relay-retaining portion 42A, except for being larger than the first relay-retaining portion 42A. For this reason, the first relay-retaining portion 42A will be described in detail below, and a description of the second relay-retaining portion 42B and the third relay-retaining portion 42C is omitted, with those components thereof that are the same as the components of the first relay-retaining portion 42A being denoted by the same reference numerals.

The first relay-retaining portion 42A includes a relay-retaining tube 43, a relay-retaining wall 44, and two relay-fixing columns 45.

Figure 12:
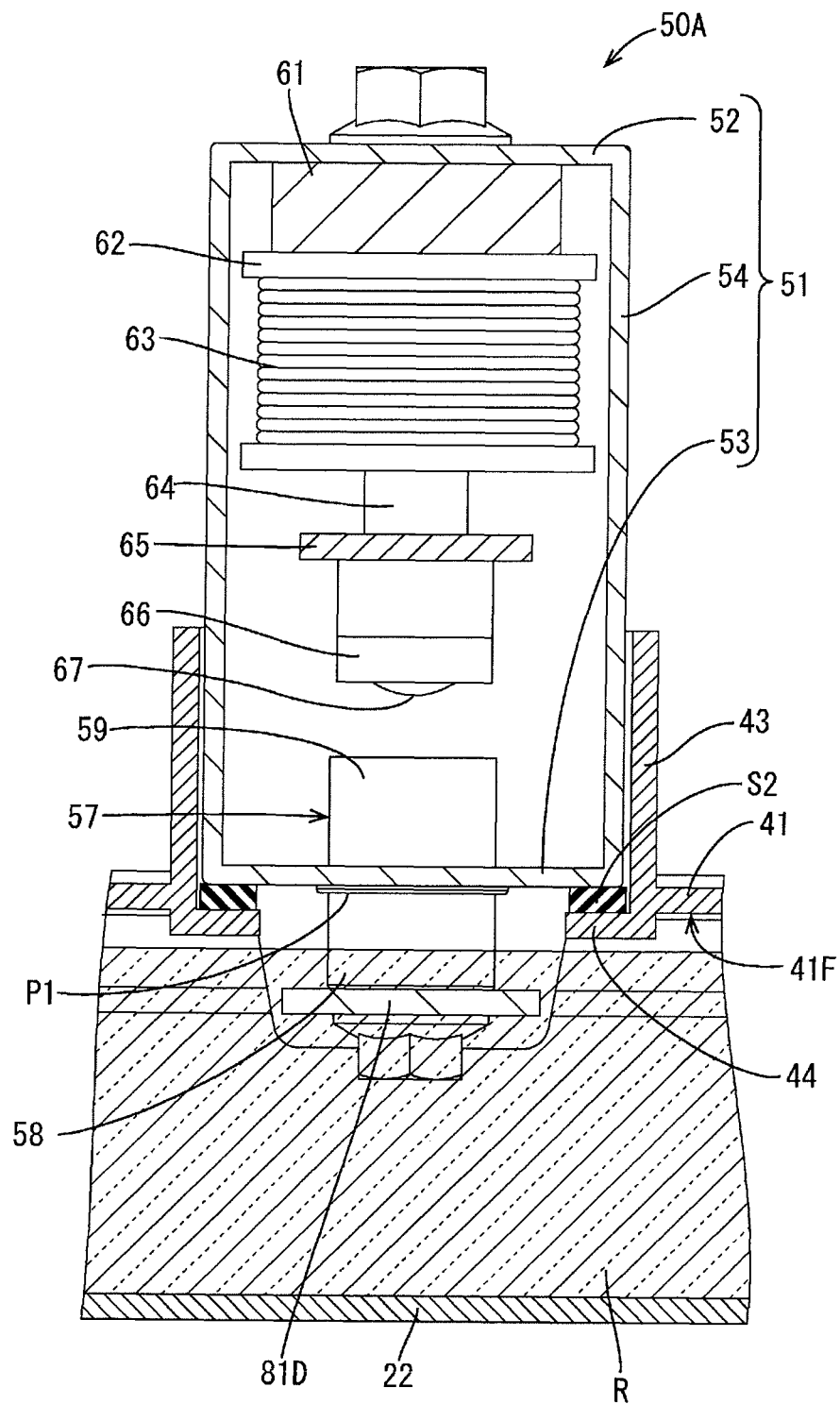
FIG. 12 is an enlarged view of an area within a circle R2 in FIG. 9.

As shown in FIGS. 8 and 12, the relay-retaining tube 43 is a rectangular tubular portion that opens at both ends and is disposed passing through the main plate 41, one end portion thereof slightly protruding from the switchboard 40 toward the cooling case 20, while the other major portion extending toward the opposite side to the cooling case 20. As shown in FIG. 12, the relay-retaining wall 44 is a plate wall-like portion that extends inward from an opening edge that faces the cooling case 20, of the relay-retaining tube 43 and is perpendicular to the relay-retaining tube 43. As shown in FIG. 8, each of the two relay-fixing columns 45 is a column-shaped portion that is disposed adjacent to the relay-retaining tube 43 and extends from the main plate 41 to the opposite side to the cooling case 20, and has, in its end portion on the opposite side to the main plate 41, a nut accommodating portion 46 that accommodates a nut (not shown) and a bolt insertion hole 47 into which a bolt B is to be inserted.

Figure 4:
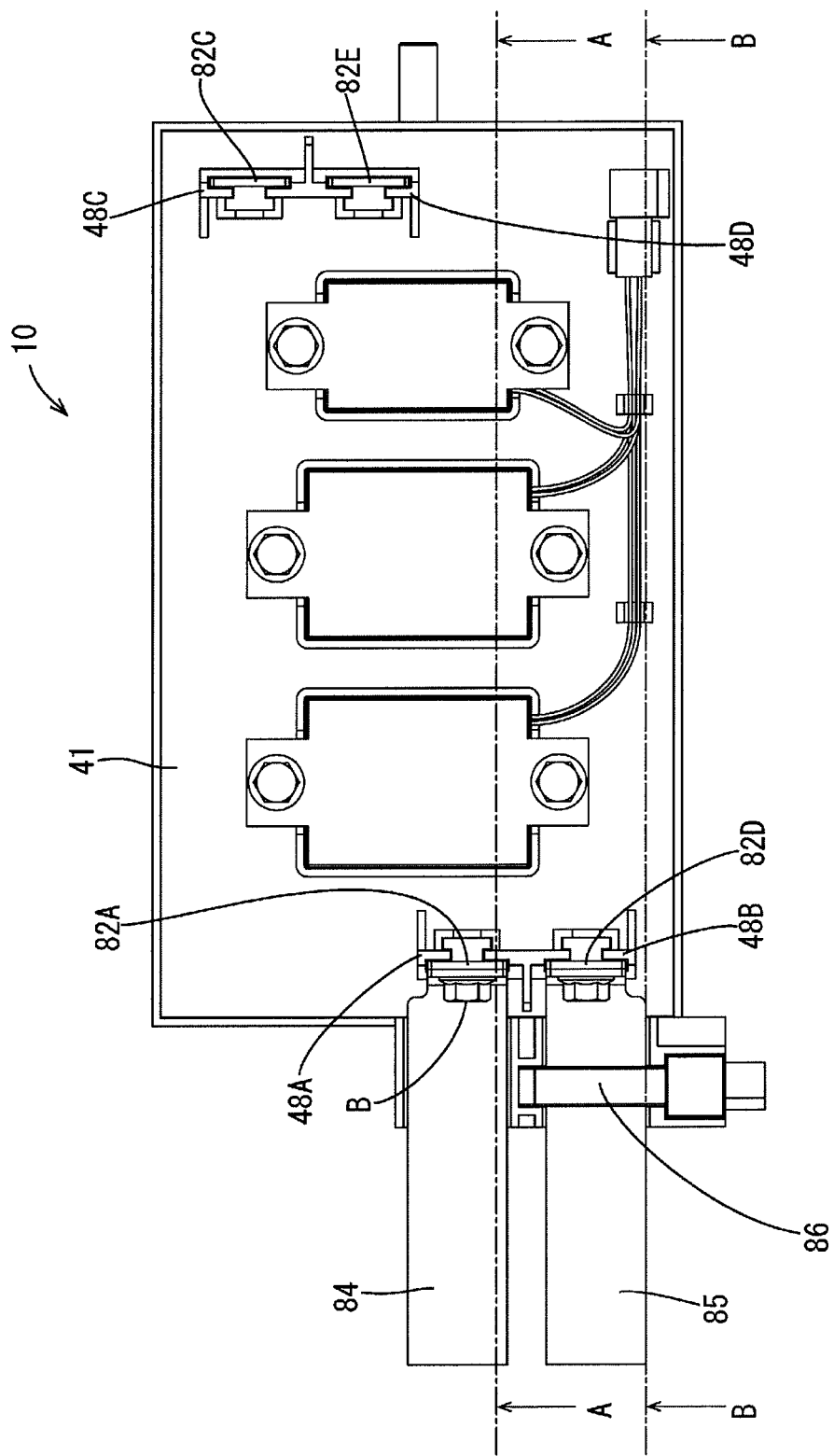
FIG. 4 is a plan view of the electrical junction box.

Two of the four connectors 48A, 48B, 48C, and 48D constitute a first positive electrode connector 48A and a first negative electrode connector 48B for connection to the power supply, and are arranged side-by-side on one end portion of the main plate 41 as shown in FIG. 4. The other two connectors constitute a second positive electrode connector 48C and a second negative electrode connector 48D for connection to the load, and are arranged side-by-side on the opposite side to the first positive electrode connector 48A and the first negative electrode connector 48B across the three relay-retaining portions 42A, 42B, and 42C.

Relays 50A, 50B, and 50C

The precharge relay 50A retained by the first relay-retaining portion 42A, the positive electrode main relay 50B retained by the second relay-retaining portion 42B, and the negative electrode main relay 50C retained by the third relay-retaining portion 42C are arranged in this order from the right side in FIG. 9. The positive electrode main relay 50B and the negative electrode main relay 50C have the same configuration as the precharge relay 50A, except for being larger than the precharge relay 50A. For this reason, the precharge relay 50A will be described in detail below, and a description of the positive electrode main relay 50B and the negative electrode main relay 50C is omitted, with those components thereof that are the same as the components of the precharge relay 50A being denoted by the same reference numerals.

As shown in FIG. 12, the precharge relay 50A includes a relay case 51, two fixed terminals 57 that are attached to the relay case 51, and a coil 63 and a movable member 66 that are accommodated in the relay case 51.

The relay case 51 is a rectangular case that is made of a synthetic resin and includes rectangular plate-shaped upper and lower walls 52 and 53 that are arranged opposing each other and a rectangular tubular peripheral wall 54 that connects the upper wall 52 and the lower wall 53 to each other. As shown in FIG. 3, two attachment pieces 55 extend from the upper wall 52. Each of the two attachment pieces 55 is a rectangular plate piece-like portion and extends from a peripheral edge of the upper wall 52 so as to be flush with the upper wall 52.

Each of the two fixed terminals 57 is a cylindrical member made of metal and is disposed passing through the lower wall 53. A packing P1 formed of an elastic member made of rubber or the like is disposed between each fixed terminal 57 and the lower wall 53, and a gap between the fixed terminal 57 and the lower wall 53 is sealed in a liquid-tight manner by the packing P1. One end portion of each fixed terminal 57 that is disposed outside the relay case 51 constitutes a busbar contact 58 (corresponding to a contact portion) and has a bolt hole (not shown) that opens into this busbar contact 58. The other end portion of each fixed terminal 57 that is disposed inside the relay case 51 constitutes a fixed contact 59.

A coil bobbin 62 fixed to the upper wall 52 via a pedestal portion 61 is disposed in the relay case 51, and the coil 63 is formed by a metal wire material being wound around the coil bobbin 62. A core (not shown) made of a magnetic material is accommodated in the coil bobbin 62. A protruding shaft portion 64 protrudes from the coil bobbin 62 toward the lower wall 53. A magnetic member 65 made of a magnetic material is fixed to an end portion of the protruding shaft portion 64.

The movable member 66 is disposed on a surface of the magnetic member 65 that faces the lower wall 53. The movable member 66 is made of a material that has conductivity and that can be attracted to the magnetic member 65 by magnetic attraction. The movable member 66 has two movable contacts 67 on its surface that faces the fixed terminals 57, each contact 67 bulging into a hemispherical shape. Each of the two movable contacts 67 is disposed opposing a corresponding one of the two fixed contacts 59. Although not shown in detail, a spring that biases the movable member 66 toward the fixed terminal 57 is disposed between the movable member 66 and the magnetic member 65. The resilient force of this spring biases the movable member 66 toward the fixed terminal 57, so that the movable contacts 67 come into contact with the respective fixed contacts 59. In a state in which current flows through the coil 63, the movable member 66 is attracted to the magnetic member 65 by a magnetic force generated by the coil 63 and the core. Thus, the electrical connection between the fixed contacts 59 and the respective movable contacts 67 is cut off.

Figure 6:
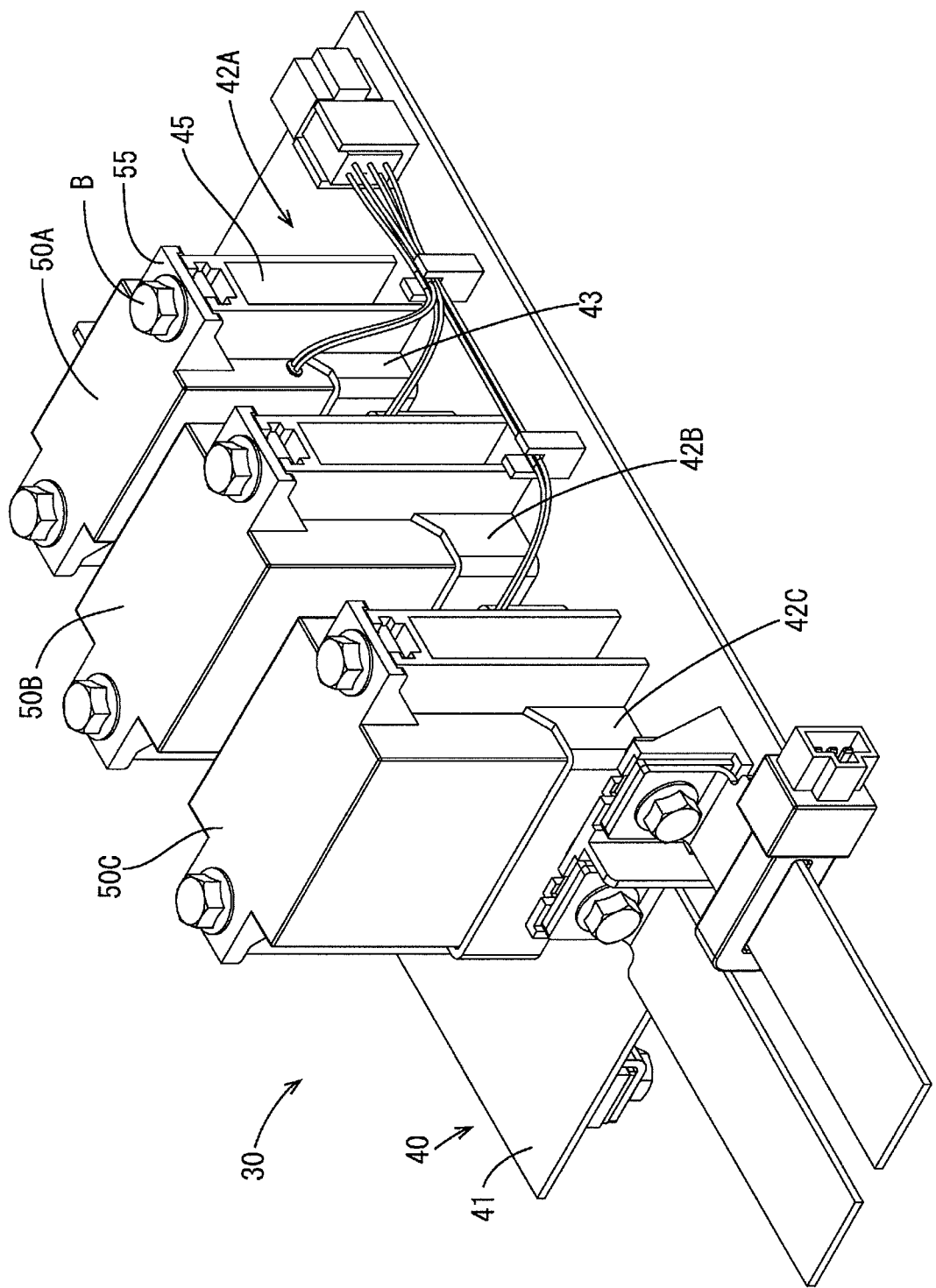
FIG. 6 is a perspective view of a circuit assembly.

As shown in FIG. 6, the precharge relay 50A is retained by the first relay-retaining portion 42A by a portion of the precharge relay 50A that is adjacent to the lower wall 53 being accommodated in the relay-retaining tube 43 of the first relay-retaining portion 42A and the two attachment pieces 55 being respectively fixed to the two relay-fixing columns 45 with the bolts B. As shown in FIG. 12, the lower wall 53 is supported by the relay-retaining wall 44. The busbar contact 58 of each of the two fixed terminals 57 protrudes from the relay-retaining wall 44 toward the bottom wall 22, and is therefore in a state in which it is disposed on the case-facing surface 41F of the switchboard 40. On the other hand, the relay case 51 is located on the opposite side to the cooling case 20 with respect to the main plate 41. That is to say, the entire relay case 51 is located outside the cooling case 20. A seal ring S2 is disposed between the relay-retaining wall 44 and the lower wall 53, and a gap between the switchboard 40 and the precharge relay 50A is sealed in a liquid-tight manner by the seal ring S2.

Similarly, the positive electrode main relay 50B is retained by the second relay-retaining portion 42B, and the negative electrode main relay 50C is retained by the third relay-retaining portion 42C.

Precharge Resistor 70

The precharge resistor 70 is a resistor that is disposed on the case-facing surface 41F of the switchboard 40, and includes a resistor main body 71 and two terminal portions 72 that extend continuously from the resistor main body 71.

Busbars 80A, 80B, 80C, 80D, and 80E

Figure 7:
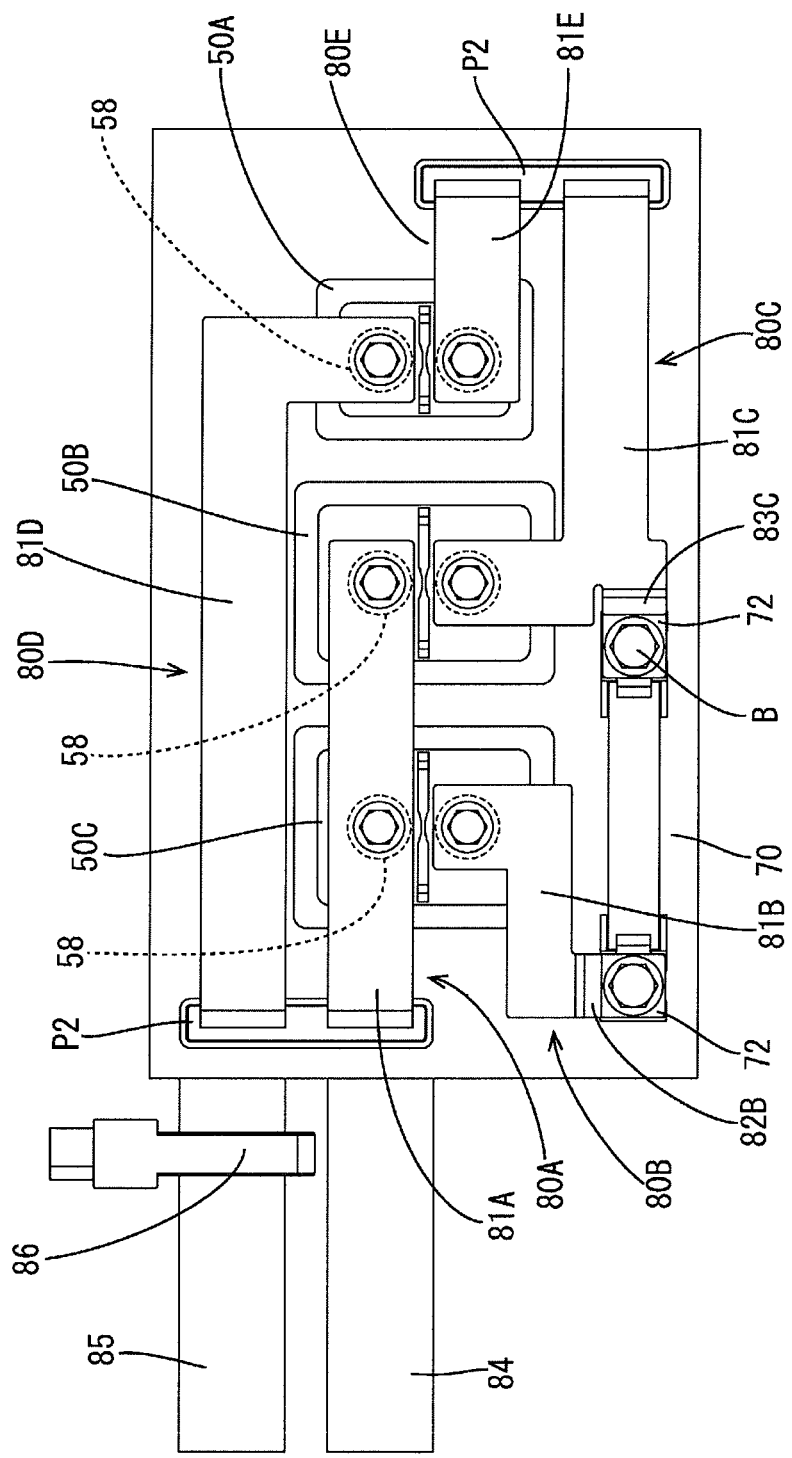
FIG. 7 is a bottom view of the circuit assembly.

The plurality of busbars include five busbars (first positive electrode busbar 80A, second positive electrode busbar 80B, third positive electrode busbar 80C, first negative electrode busbar 80D, and second negative electrode busbar 80E) that are disposed on the case-facing surface 41F of the switchboard 40. As shown in FIGS. 3 and 7, each of the busbars 80A, 80B, 80C, 80D, and 80E is an elongated plate-shaped member made of metal, and some of these busbars, namely, the busbars 80B, 80C, and 80D have bent shapes in accordance with the wiring route.

As shown in FIG. 3, the first positive electrode busbar 80A includes an elongated plate-shaped busbar main body 81A and a connecting portion 82A that extends from one end of the busbar main body 81A perpendicularly to the busbar main body 81A. As shown in FIG. 7, the busbar main body 81A abuts against and is fixed to one of the busbar contacts 58 of the positive electrode main relay 50B and the busbar contact 58 of one of the fixed terminals 57 of the negative electrode main relay 50C by bolts B. As shown in FIG. 4, the connecting portion 82A passes through the main plate 41 and is arranged in the first positive electrode connector 48A, and is fixed to a positive electrode connecting busbar 84 by a bolt B. The positive electrode connecting busbar 84 is connected to a positive electrode of the power supply.

As shown in FIG. 3, the second positive electrode busbar 80B includes an elongated plate-shaped busbar main body 81B and a connecting portion 82B that extends continuously from one end of the busbar main body 81B. As shown in FIG. 7, the busbar main body 81B abuts against and is fixed to the other busbar contact 58 of the negative electrode main relay 50C by a bolt B. The connecting portion 82B is fixed to one of the terminal portions 72 of the precharge resistor 70 by a bolt B.

As shown in FIG. 3, the third positive electrode busbar 80C includes an elongated plate-shaped busbar main body 81C, a first connecting portion 82C that extends from one end of the busbar main body 81C perpendicularly to the busbar main body 81C, and a second connecting portion 83C that extends continuously from a portion of the busbar main body 81C that is located near the other end thereof. As shown in FIG. 7, the busbar main body 81C abuts against and is fixed to the other busbar contact 58 of the positive electrode main relay 50B by a bolt B. As shown in FIG. 4, the first connecting portion 82C passes through the main plate 41 and is arranged in the second positive electrode connector 48C, and is connected to the load. The second connecting portion 83C is fixed to the other terminal portion 72 of the precharge resistor 70 by a bolt B.

As shown in FIG. 3, the first negative electrode busbar 80D includes an elongated plate-shaped busbar main body 81D and a connecting portion 82D that extends from one end of the busbar main body 81D perpendicularly to the busbar main body 81D. As shown in FIG. 7, the busbar main body 81D abuts against and is fixed to one of the busbar contacts 58 of the precharge relay 50A by a bolt B. As shown in FIG. 4, the connecting portion 82D passes through the main plate 41 and is arranged in the first negative electrode connector 48B, and is fixed to a negative electrode connecting busbar 85 by a bolt B. The negative electrode connecting busbar 85 is connected to a negative electrode of the power supply. Moreover, a current sensor 86 is attached to the negative electrode busbar 85.

As shown in FIG. 3, the second negative electrode busbar 80E includes an elongated plate-shaped busbar main body 81E and a connecting portion 82E that extends from one end of the busbar main body 81E perpendicularly to the busbar main body 81E. As shown in FIG. 7, the busbar main body 81E abuts against and is fixed to the other busbar contact 58 of the precharge relay 50A by a bolt B. As shown in FIG. 4, the connecting portion 82E passes through the main plate 41 and is arranged in the second negative electrode connector 48D, and is connected to the load.

Packings P2 formed of elastic members made of rubber or the like are disposed between the main plate 41 and the connecting portions 82A, 82C, 82D, and 82E passing through the main plate 41, and gaps between the main plate 41 and the connecting portions 82A, 82C, 82D, and 82E are sealed by the packings P2 in a liquid-tight manner.

Cooling by Liquid Coolant R

As shown in FIGS. 9 and 10, the entire precharge resistor 70 is disposed on the case-facing surface 41F of the switchboard 40 and immersed in the liquid coolant R. Moreover, as shown in FIG. 7, portions of the five busbars 80A, 80B, 80C, 80D, and 80E excluding the connecting portions 82A, 82C, 82D, and 82E for connection to the power supply or the load are disposed on the case-facing surface 41F of the switchboard 40, and these portions are immersed in the liquid coolant R as shown in FIGS. 9 and 10.

Moreover, the two busbar contacts 58 of the precharge relay 50A are immersed in the liquid coolant R. The busbar contacts 58 of the other two relays 50B and 50C are also immersed in the liquid coolant R.

Heat that is generated by the busbars 80A, 80B, 80C, 80D, and 80E, the precharge resistor 70, and the busbar contacts 58 when current flows is transferred to the liquid coolant R. Thus, the busbars 80A, 80B, 80C, 80D, and 80E, the precharge resistor 70, and the busbar contacts 58 can be cooled.

Summary

As described above, according to the present embodiment, the electrical junction box 10 that is disposed between the power supply and the load includes the cooling case 20 that has the opening 24, the circuit assembly 30 that is disposed closing the opening 24 of the cooling case 20, and the liquid coolant R that is stored in the cooling case 20. The circuit assembly 30 has the case-facing surface 41F that faces the cooling case 20, and includes the plurality of busbars 80A, 80B, 80C, 80D, and 80E that are disposed on the case-facing surface 41F and constitute the conductive path between the power supply and the load, and portions of the busbars 80A, 80B, 80C, 80D, and 80E excluding the connecting portions 82A, 82C, 82D, and 82E for connection to the power supply or the load are immersed in the liquid coolant R.

Since a relatively high current flows through the busbars 80A, 80B, 80C, 80D, and 80E, which constitute the conductive path between the power supply and the load, a relatively large amount of heat is generated from the busbars 80A, 80B, 80C, 80D, and 80E. According to the present embodiment, since the portions of the busbars 80A, 80B, 80C, 80D, and 80E excluding the connecting portions 82A, 82C, 82D, and 82E for connection to the power supply or the load are immersed in the liquid coolant R, the heat generated from the busbars 80A, 80B, 80C, 80D, and 80E when current flows is transferred to the liquid coolant R. Thus, the busbars 80A, 80B, 80C, 80D, and 80E can be efficiently cooled, and therefore, the electrical junction box 10 in which the busbars 80A, 80B, 80C, 80D, and 80E are arranged can be efficiently cooled. Moreover, since a member that generates a relatively small amount of heat, of the members installed in the circuit assembly 30, can be disposed on a surface of the circuit assembly 30 that is located on the opposite side to the cooling case 20, the size of the cooling case 20 and the amount of liquid coolant R can be set to be the minimum necessary size and amount.

Moreover, the circuit assembly 30 includes the three relays 50A, 50B and 50C that have the fixed terminals 57. Each fixed terminal 57 includes the busbar contact 58 that abuts against one of the busbars 80A, 80B, 80C, 80D, and 80E, and the busbar contacts 58 are immersed in the liquid coolant R.

With this configuration, since the busbar contacts 58, which generate a relatively large amount of heat, of each of the three relays 50A, 50B, and 50C are immersed in the liquid coolant R, the heat generated by the busbar contacts 58 when current flows is transferred to the liquid coolant R. Thus, the electrical junction box 10 in which the relays 50A, 50B, and 50C are arranged can be efficiently cooled. Moreover, the entire relay case 51 is located outside the cooling case 20. Thus, the size of the cooling case 20 and the amount of liquid coolant R can be set to be the minimum necessary size and amount.

Moreover, the circuit assembly 30 includes the two main relays 50B and 50C as well as the precharge relay 50A and the precharge resistor 70 that are connected to the main relays 50B and 50C in parallel and constitute a precharge circuit, and the precharge resistor 70 is immersed in the liquid coolant R.

With this configuration, the precharge resistor 70 that generates a relatively large amount of heat is immersed in the liquid coolant R, and therefore, the heat that is generated by the precharge resistor 70 when current flows is transferred to the liquid coolant R. Thus, the electrical junction box 10 in which the precharge resistor 70 is arranged can be efficiently cooled.

Moreover, the cooling case has the inlet port 25, through which the liquid coolant R can flow into the cooling case, and the outlet port 26, through which the liquid coolant R can flow out of the cooling case.

With this configuration, the liquid coolant R that has been cooled can be allowed to flow into the cooling case 20 through the inlet port 25, and the liquid coolant R whose temperature has been increased as a result of receiving the heat can be allowed to flow to the outside of the cooling case 20 through the outlet port 26. Thus, the efficiency of cooling the electrical junction box 10 can be improved.

Embodiment 2

Figure 15:
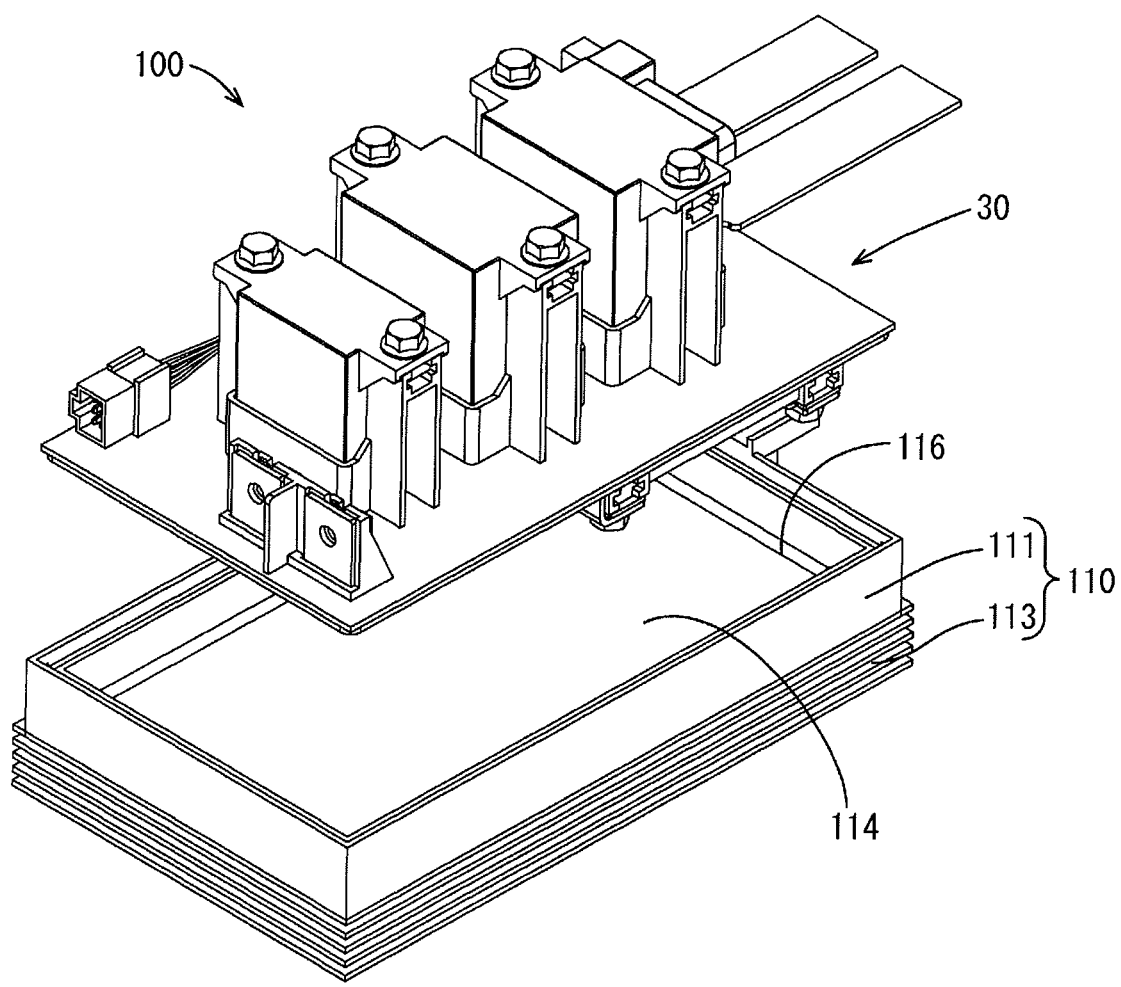
FIG. 15 is a perspective view showing a circuit assembly and a cooling case of the electrical junction box in a separated manner.
Figure 16:
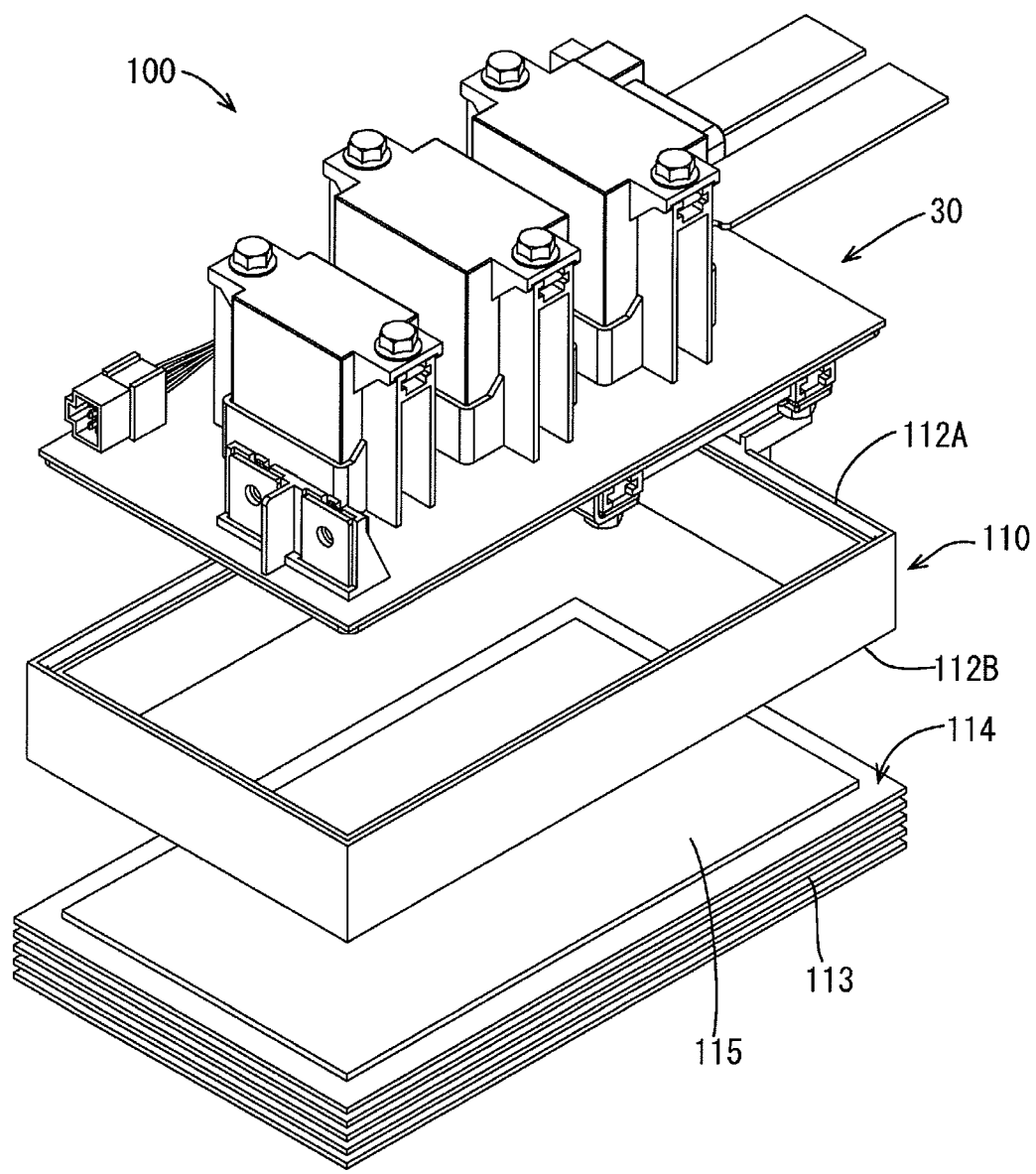
FIG. 16 is an exploded perspective view of the electrical junction box.

Next, Embodiment 2 will be described with reference to FIGS. 14 to 16. An electrical junction box 100 of Embodiment 2 differs from the electrical junction box of Embodiment 1 in that a cooling case 110 includes a heat sink 113 instead of including the inlet port 25, the outlet port 26, the inlet pipe 25P, and the outlet pipe 26P. In the following description, the same components as those of the first embodiment will be denoted by the same reference numerals, and their description is omitted.

The cooling case 110 includes a frame 111 and a heat sink 113 fixed to the frame 111. As shown in FIG. 16, the frame 111 is a flat, rectangular tubular member that has openings at both ends and is made of an insulating synthetic resin.

The heat sink 113 is a heat dissipation member made of a metal that has excellent heat conductivity. As shown in FIG. 16, the heat sink 113 has a closing surface 114 that is disposed closing one opening 112A of the openings of the frame 111, and a raised bottom portion 115 protruding from the closing surface 114. The raised bottom portion 115 is a flat rectangular protruding portion that is disposed on a portion of the closing surface 114 excluding a portion that is adjacent to its outer peripheral edge. The opening 112A of the frame 111 is closed by the raised bottom portion 115 substantially tightly fitting into the opening 112A and a portion around the raised bottom portion 115, of the closing surface 114 abutting against the frame 111. As shown in FIG. 15, a gap between the frame 111 and the closing surface 114 is sealed by a caulking material 116. As in the case of Embodiment 1, the liquid coolant R is stored in an inner space of the cooling case 110 that is surrounded by the frame 111 and the closing surface 114, and the liquid coolant R is in contact with the raised bottom portion 115.

As in the case of Embodiment 1, an opening 112B of the frame 111 that is located on the opposite side to the heat sink 113 is closed by the circuit assembly 30. Although not shown in detail, as in the case of Embodiment 1, the portions of the five busbars 80A, 80B, 80C, 80D, and 80E excluding the connecting portions 82A, 82C, 82D, and 82E, the precharge resistor 70, as well as the busbar contacts 58 of the three relays 50A, 50B, and 50C are immersed in the liquid coolant R.

Figure 14:
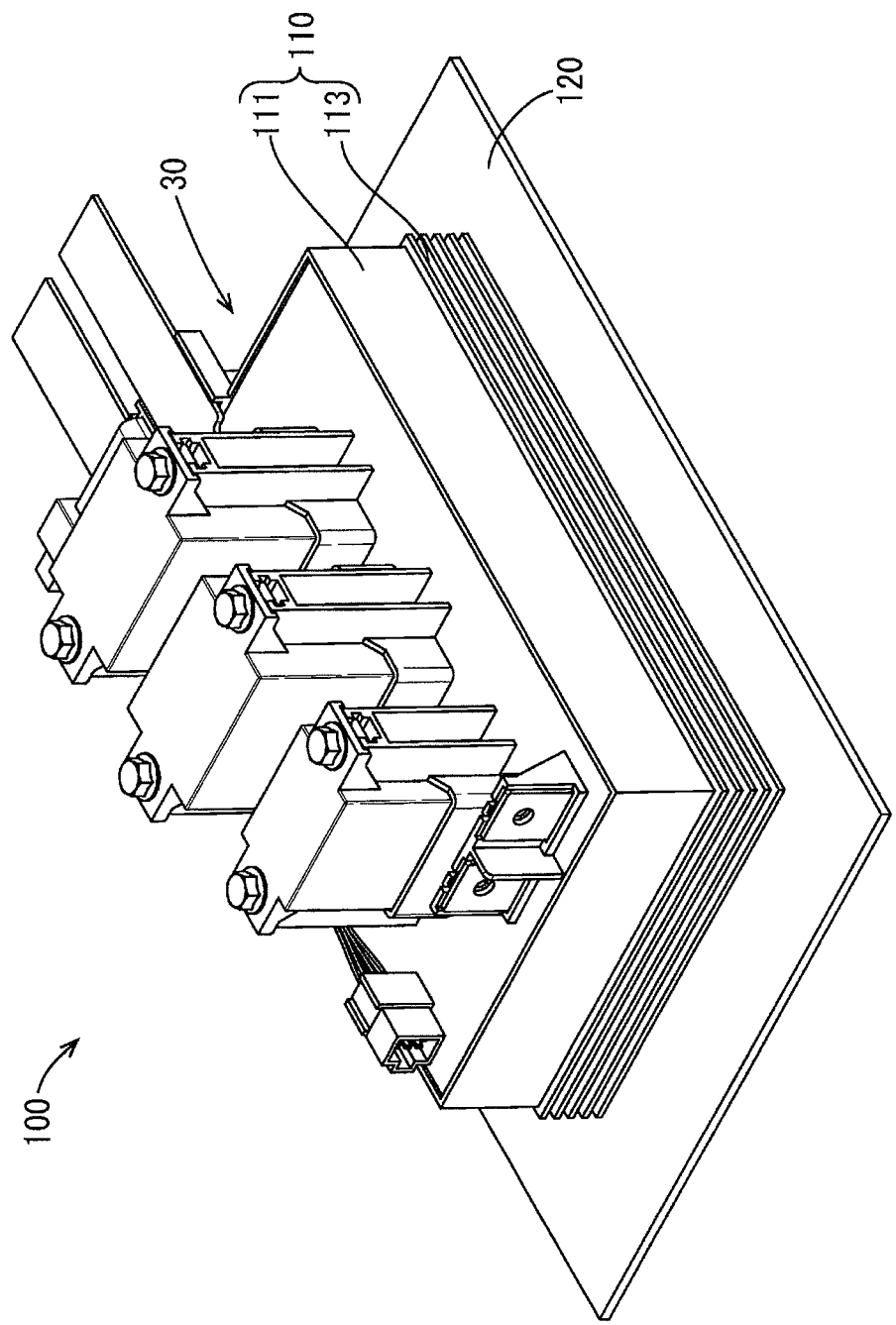
FIG. 14 is a perspective view showing a state in which an electrical junction box of Embodiment 2 is attached to a vehicle body.

As shown in FIG. 14, the heat sink 113 is disposed with its surface on the opposite side to the closing surface 114 abutting against a vehicle body 120.

The heat that is generated by the busbars 80A, 80B, 80C, 80D, and 80E, the precharge resistor 70, and the busbar contacts 58 when current flows is transferred to the liquid coolant R. Thus, the busbars 80A, 80B, 80C, 80D, and 80E, the precharge resistor 70, and the busbar contacts 58 can be cooled. The heat transferred to the liquid coolant R is conducted to the vehicle body 120 via the heat sink 113 and is dissipated.

In the present embodiment as well, the electrical junction box 100 can be efficiently cooled as in the case of Embodiment 1.

Moreover, the cooling case 110 includes the heat sink 113 that is in contact with the liquid coolant R. With this configuration, the heat received by the liquid coolant R can be efficiently dissipated via the heat sink 113. Thus, the efficiency of cooling the electrical junction box 100 can be improved.

Other Embodiments

The technology disclosed in the present specification is not limited to the embodiments that have been described above with reference to the drawings, and various embodiments such as those described below, for example, are also embraced therein.

(1) According to the foregoing embodiments, the circuit assembly includes the five busbars 80A, 80B, 80C, 80D, and 80E as well as the three relays 50A, 50B, and 50C. However, the number of busbars and the number of relays are not limited to those of the foregoing embodiments and can be set to be any desired numbers.

(2) In the foregoing embodiments, a configuration in which the precharge resistor 70 is immersed in the liquid coolant R has been described. However, the component immersed in the liquid coolant R is not limited to a precharge resistor. A configuration may also be adopted in which any electronic component that generates a relatively large amount of heat is disposed on a surface of a circuit assembly that faces a case, and is immersed in a liquid coolant.

LIST OF REFERENCE NUMERALS 10, 100 Electrical junction box
20 Cooling case (Case)

24 Opening
25 Inlet port
26 Outlet port
30 Circuit assembly
41F Case-facing surface
50A Precharge relay (Relay)
50B Positive electrode main relay (Relay, Main relay)
50C Negative electrode main relay (Relay, Main relay)
57 Fixed terminal
58 Busbar contact (Contact portion)
70 Precharge resistor
80A First positive electrode busbar (Busbar)
80B Second positive electrode busbar (Busbar)
80C Third positive electrode busbar (Busbar)
80D First negative electrode busbar (Busbar)
80E Second negative electrode busbar (Busbar)
113 Heat sink
R Liquid coolant

What is claimed is:

1. An electrical junction box configured to be disposed between a power supply and a load, the electrical junction box comprising:
   a case that has an opening;
   a circuit assembly that is disposed in a position closing the opening of the case; and
   a liquid coolant that is stored in the case,
   wherein the circuit assembly has a case-facing surface that faces the case, and includes a busbar that is disposed on the case-facing surface and constitutes a conductive path between the power supply and the load,
   the busbar is immersed in the liquid coolant,
   the circuit assembly includes a main relay, as well as a precharge relay and a precharge resistor that are connected to the main relay in parallel and constitute a precharge circuit, and
   the precharge resistor is immersed in the liquid coolant.

2. The electrical junction box according to claim 1,
   wherein at least one of the main relay and the precharge relay has a terminal,
   the terminal includes a contact portion connected to the busbar, and
   the contact portion is immersed in the liquid coolant.

3. The electrical junction box according to claim 1,
   wherein the case has an inlet port through which the liquid coolant can flow into the case and an outlet port through which the liquid coolant can flow out of the case.

4. The electrical junction box according to claim 1,
   wherein the case includes a heat sink that is in contact with the liquid coolant.

5. The electrical junction box according to claim 1,
   wherein the case includes a vessel space inside the case that opens to an outside of the case via the opening, and
   the liquid coolant is stored in the vessel space.

6. The electrical junction box according to claim 5,
   wherein the opening is disposed opposite to a bottom wall of the case across the vessel space.

7. The electrical junction box according to claim 5,
   wherein the circuit assembly includes a plate that closes the opening, and
   a seal is formed between the case and a periphery of the plate to seal the opening in a liquid-tight manner.

8. The electrical junction box according to claim 7,
   wherein the plate holds at least one of the main relay and the precharge relay so that at least a portion of the at least one of the main relay and the precharge relay passes through the plate and extends into the vessel space.

9. The electrical junction box according to claim 8,
   wherein a seal is formed between the at least one of the main relay and the precharge relay and a periphery of an opening in the plate through which at least the portion of the at least one of the main relay and the precharge relay passes.

\* \* \* \* \*